(12) United States Patent
Chen et al.

(10) Patent No.: US 7,202,512 B2
(45) Date of Patent: Apr. 10, 2007

(54) CONSTRUCTION OF THIN STRAIN-RELAXED SIGE LAYERS AND METHOD FOR FABRICATING THE SAME

(75) Inventors: Pang-Shiu Chen, Hsinchu (TW);
Sheng-Wei Lee, Hsinchu (TW);
Kao-Feng Liao, Hsinchu (TW);
Lih-Juann Chen, Hsinchu (TW);
Chee-Wee Liu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 116 days.

(21) Appl. No.: 10/915,362

(22) Filed: Aug. 11, 2004

(65) Prior Publication Data

US 2005/0179028 A1    Aug. 18, 2005

(30) Foreign Application Priority Data

Feb. 17, 2004 (TW) ............................. 93103814 A

(51) Int. Cl.
*H01L 29/06* (2006.01)
(52) U.S. Cl. ................... 257/190; 257/E21.125

(58) Field of Classification Search ............... 257/19, 257/190
See application file for complete search history.

(56) References Cited

U.S. PATENT DOCUMENTS

| 5,221,413 A | 6/1993 | Brasen et al. |
| 6,291,321 B1 | 9/2001 | Fitzgerald |
| 6,660,393 B2 * | 12/2003 | Saitoh et al. ............... 428/446 |
| 2003/0107032 A1 * | 6/2003 | Yoshida ....................... 257/19 |

* cited by examiner

*Primary Examiner*—B. William Baumeister
*Assistant Examiner*—Matthew L. Reames
(74) *Attorney, Agent, or Firm*—Harness, Dickey & Pierce, P.L.C.

(57) ABSTRACT

A construction of thin strain-relaxed SiGe layers and method for fabricating the same is provided. The construction includes a semiconductor substrate, a SiGe buffer layer formed on the semiconductor substrate, a Si(C) layer formed on the SiGe buffer layer, and an relaxed SiGe epitaxial layer formed on the Si(C) layer. The Si(C) layer is employed to change the strain-relaxed mechanism of the relaxed SiGe epitaxial layer formed on the Si(C) layer. Therefore, a thin relaxed SiGe epitaxial layer with low threading dislocation density, smooth surface is available. The fabricating time for fabricating the strain-relaxed SiGe layers is greatly reduced and the surface roughness is also improved.

13 Claims, 6 Drawing Sheets
(1 of 6 Drawing Sheet(s) Filed in Color)

CONSTRUCTION OF THIN STRAIN-RELAXED SIGE LAYERS AND METHOD FOR FABRICATING THE SAME

BACKGROUND OF THE INVENTION

This Non-provisional application claims priority under 35 U.S.C. § 119(a) on Patent Application No. 093103814 filed in Taiwan on Feb. 17, 2004, the entire contents of which are hereby incorporated by reference.

1. Field of Invention

The present invention relates to a construction of strain-relaxed SiGe layers and method for fabricating the same, and more particularly to a construction of thin strain-relaxed SiGe layers and method for fabricating the same for strained Si using SixC1-x as insert layers.

2. Related Art

The semiconductor and integrated circuit technology has been developed in recent years, to be compact with high operation speed. How to increase the operation speed of the semiconductor device with lower power consumption constitutes an important issue in the very large scale integration (VLSI) field.

Researches on SiGe material have shown that when a composite layer of Si and Ge is grown on a silicon substrate and followed with a strained Si layer, a two-dimensional porous layer of electrons and holes is formed at the interface between the relaxed SiGe layer and the strained silicon channel, which increases electron drift mobility in a channel of the semiconductor device and, consequently, the semiconductor device performance.

In the conventional SiGe epitaxial technology, the strain-relaxed SiGe epitaxial layer is formed on the Si substrate, and a strained Si layer is then formed on the epitaxial layer. The subsequent structure is employed as a "virtual substrate" for replacing the original Si substrate, and may be applied to an integrated process of the Si substrate and the transistors with high carrier mobility, MOS transistors, or III–V family semiconductors. These strain-relaxed SiGe epitaxial layers need the characteristics of high strain-relax, smooth surface, and relatively low density of threading dislocations.

The conventional SiGe epitaxial growth technology, for example, the compositionally grated buffer, takes long time and induces the increasing roughness on the surface of the epitaxial layer. The characteristic of the elements may be destroyed.

The prior art disclosed some solutions regarding the SiGe epitaxy growth technology. U.S. Pat. No. 6,291,321 provides a graded SiGe buffer for the growth of the stain-relaxed SiGe epitaxial layer, which is the main technology trend. However, growth of the epitaxial with thickness takes longer time and leads to difficult alignment of the lithography process.

Besides, U.S. Pat. No. 5,221,413 provides a SiGe hetrostructure graded epitaxial layer with low dislocation formed in high temperature. However, the 413 patent does not provide any other structure regarding the dielectric layer. Furthermore, the high temperature affects the uniformity of the SiGe layer.

In the application of CMOS high speed components and optical and electronic components, the performance of the devices may be enhanced through replacing Si substrates with strain-relaxed SiGe layers. For the foregoing reasons, there is a need for highly strain-relaxed SiGe layers with low threading dislocations density, having the same relaxation of SiGe, and reducing thickness of SiGe layers.

SUMMARY OF THE INVENTION

Accordingly, the present invention is directed to a construction of thin strain-relaxed SiGe layers and method for fabricating the same that substantially obviates one or more of the problems due to limitations and disadvantages of the related art.

To achieve these and other advantages and in accordance with the purpose of the present invention, as embodied and broadly described, a construction of thin strain-relaxed SiGe layers may, for example, include a semiconductor substrate, a complete strain-relaxed SiGe buffer layer having thickness of 50 nm to 150 nm formed on the semiconductor substrate; a Si(C) layer formed on the Si buffer layer; and another SiGe buffer layer formed on the Si(C) layer.

According to an aspect of the invention, an advantage of the invention provides a construction of thin strain-relaxed SiGe layers and method for fabricating the same with a higher degree of relaxation under the situation of the same Ge composition and thickness of SiGe layer.

According to an aspect of the invention, an advantage of the invention provides a construction of thin strain-relaxed SiGe layers and method for fabricating the same with the reduction of threading dislocation density and surface roughness. A strained Si, strained Ge layer, or III–V family optical and electronic components may be formed on the epitaxial layer provided by the version of the invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The patent or application file contains at least one drawing executed in color. Copies of this patent or patent application publication with color drawing will be provided by the Office upon request and payment of the necessary fee.

The present invention will become more fully understood from the detailed description given in the illustration below only, and is thus not limitative of the present invention, wherein.

DETAILED DESCRIPTION OF THE INVENTION

Figure 1:
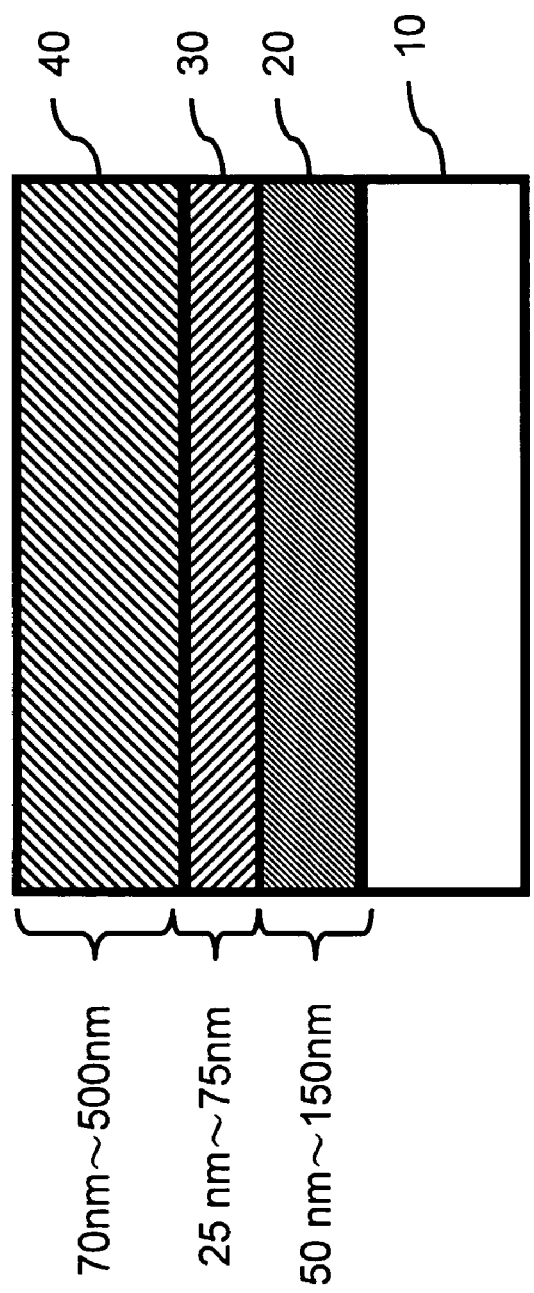
FIG. 1 illustrates the construction of the thin strain-relaxed SiGe layers according to the invention.

According the invention, a Si(C) layer is adopted to change the strain-relaxed mechanism of the SiGe epitaxial layer formed on the Si(C) layer. Refer to FIG. 1 illustrating the schematic construction. The construction includes a semiconductor substrate 10, the preferred embodiment, which is a Si substrate, a buffer layer 20 with a thickness of 50 nm to 150 nm formed on the semiconductor substrate 10, a Si(C) layer 30 with thickness of 25 nm to 75 nm formed on the buffer layer 20, and a SiGe epitaxial layer ($Si_{1-x}Ge_x$) 40 with thickness of 70 nm to 500 nm formed on the Si(C) layer 30. The lattice of the SiGe epitaxial layer 40 is different from that of the SiGe buffer layer 20. The thickness of the layers may be adjusted according to different need.

The Si(C) layer 30 is a heterostructure alloy mixed by VI family elements. The Si(C) layer 30 changes the strain mechanism of the SiGe epitaxial layer 40 such, that the SiGe epitaxial layer 40 has the characteristic of high strain relaxation. This is because the lattice constant of the Si(C) layer 30 is smaller than that of the epitaxial layer. The location where the horizontal strain force is caused by the upper and lower SiGe epitaxial layers during the relaxation process has priority for generation of the nucleation of the unmatched dislocation. Therefore, the SiGe epitaxial layer 40 with high degree of relaxation and low threading dislocation density is formed. The dislocation density formed by this structure is around $10^5 \sim 10^6$ cm$^{-2}$.

The thickness of the strain-relaxed epitaxial layer according to the version of the invention is thinner than that of the prior art, which uses the graded layer as the epitaxial layer. Therefore, the manufacture time to fabricate the epitaxial layer is greatly reduced and the roughness of the surface is suppressed.

Figure 2:
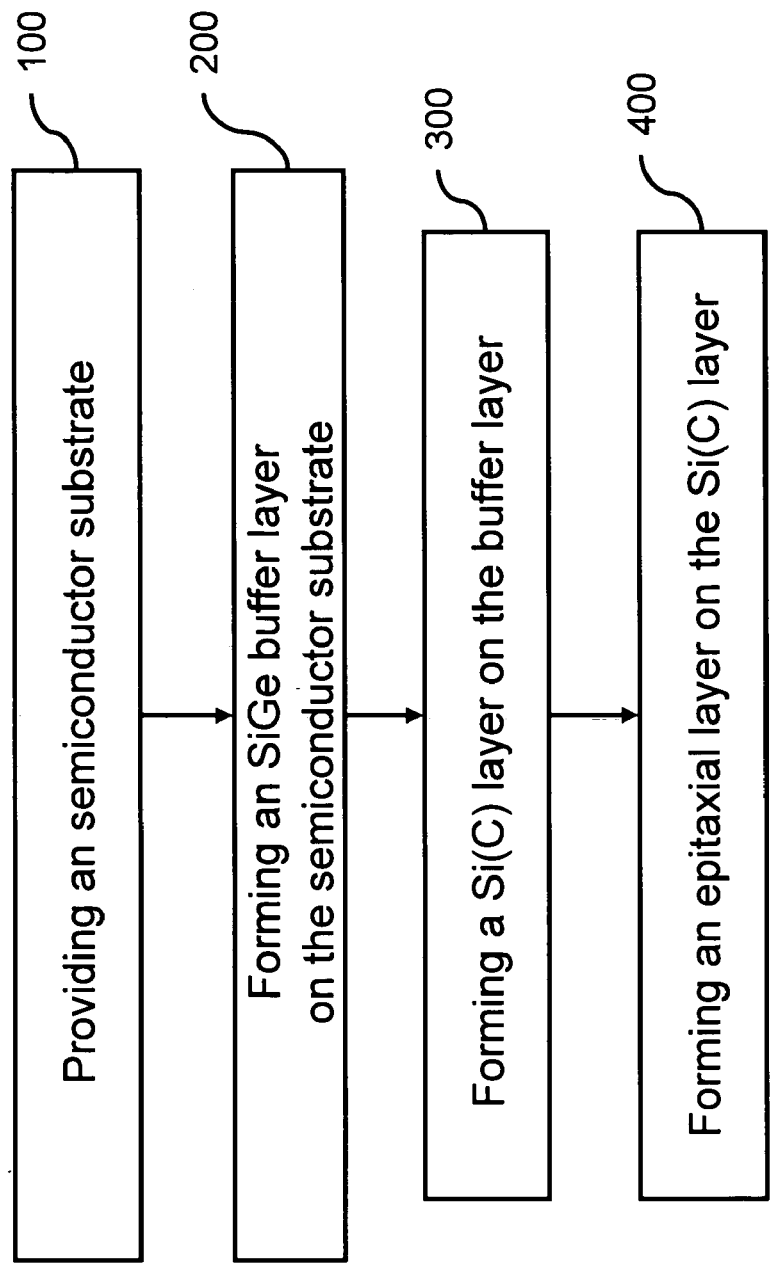
FIG. 2 illustrates the fabricating process of the thin strain-relaxed SiGe layers according to the invention.

Refer to FIG. 2 illustrating the fabricating process of the thin strain-relaxed SiGe layers according to the invention. Steps of the process can be performed in different sequences, or some of the steps can be omitted, or performed simultaneously. The sequence and number of steps are not particularly limited to those described in the following embodiments.

A semiconductor substrate is provided first (step 100). Preferred is a Si substrate. A buffer layer 20 is formed on the semiconductor substrate 10 (step 200). A Si(C) layer 30 is then formed on the buffer layer 20 (step 300), and an epitaxial layer 40 is formed on the Si(C) layer 30 finally.

Deposition of the SiGe epitaxial layer 20 in step 200 can be performed, for example, via the super vacuum chemical vapor deposition (UHVCVD), the molecule beam epitaxy (MBE), the low pressure vapor deposition (LPVCD) or the rapid thermal chemical vapor deposition (RTVCD). The epitaxial layer 40 is formed by a method which can fabricate the SiGe(C) epitaxial alloys.

Finally, the Si substrate, having the SiGe epitaxial layer ($Si_{1-x}Ge_x$), may undergo the annealing process for better strain-relaxation. A strained Si layer, a strained Ge layer, or III–V family element optical-electronic components may grow on the Si substrate, having the SiGe epitaxial layer ($Si_{1-x}Ge_x$).

Figure 3:
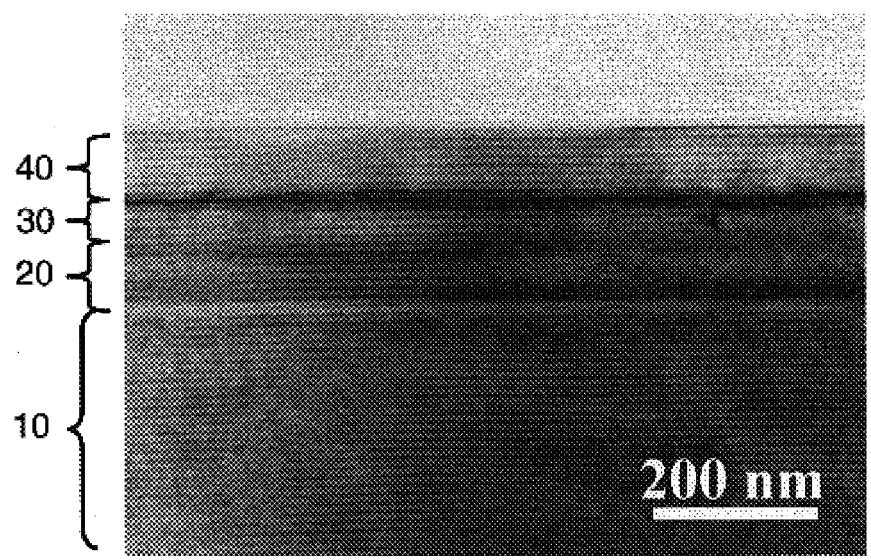
FIG. 3 illustrates the thin strain-relaxed SiGe layers according to the construction and fabricating method of the invention.

Refer to FIG. 3 illustrating the thin strain-relaxed SiGe layers according to the construction and fabricating method of the invention. As shown in the figure, the thickness of the SiGe epitaxial layer is thinner than that of the prior art. Furthermore, the graded SiGe layer is not needed.

Figure 4:
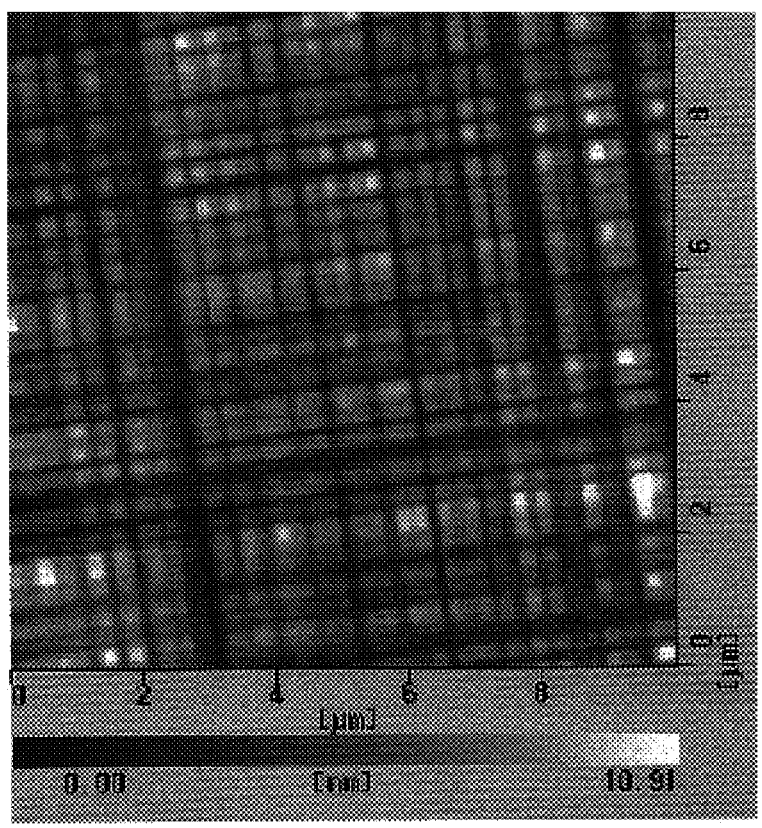
FIG. 4 illustrates the surface of the thin strain-relaxed SiGe layers according to the construction and fabricating method of the invention.

FIG. 4 illustrates the surface of the thin strain-relaxed SiGe layers according to the construction and fabricating method of the invention. The surface roughness of the strain-relaxed epitaxial layer is lower, i.e., the flat surface can be achieved.

Figure 5:
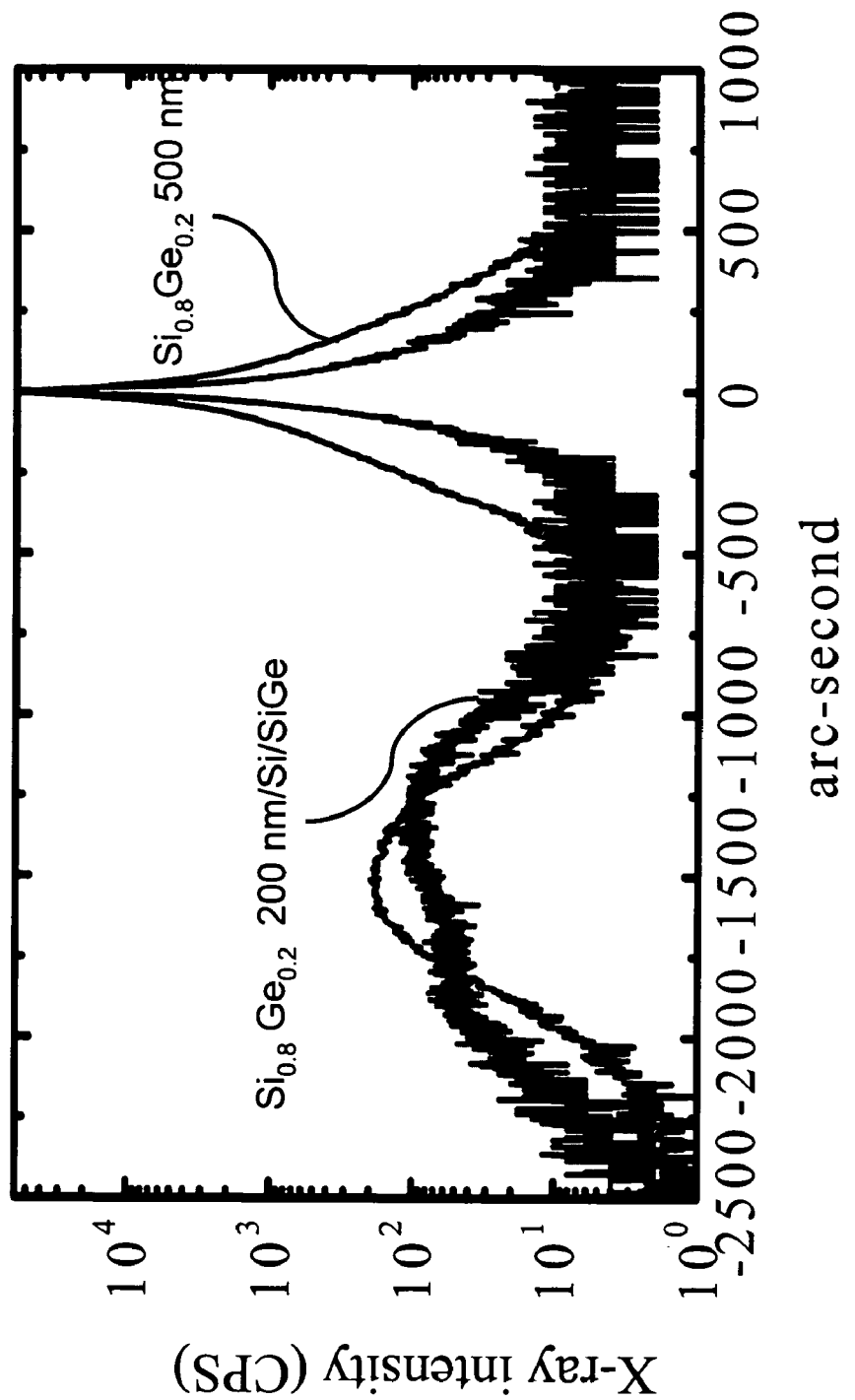
FIG. 5 illustrates the X-ray Diffraction (XRD) spectra figure of the thin strain-relaxed SiGe layers according to the invention.

FIG. 5 illustrates the X-ray Diffraction (XRD) spectra of the thin strain-relaxed SiGe layers according to the version of the invention. The SiGe epitaxial layer, having the Si(C) layer, is has a high degree of relaxation, referring to FIG. 5.

Figure 6:
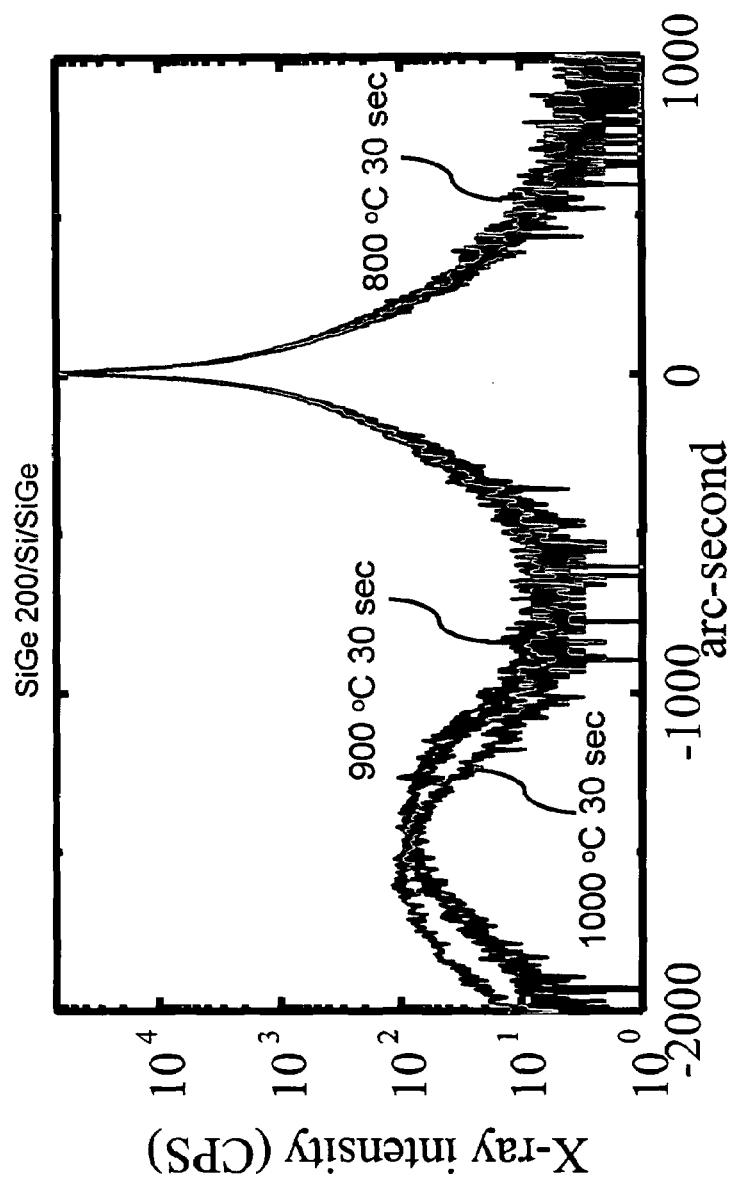
FIG. 6 illustrates the X-ray Diffraction (XRD) spectra figure in which the strain-relaxed epitaxial layer undergoes a thermal annealing process of different temperatures.

FIG. 6 illustrates the X-ray Diffraction (XRD) spectra in which the strain-relaxed epitaxial layer undergoes an annealing process of different temperatures. The degree of relaxation of the SiGe epitaxial layer is increased after an appropriate thermal annealing process.

According to the principle of the invention, a Si(C) layer is employed to change the strain-relaxed mechanism of the epitaxial layer formed on the Si(C) layer. Therefore, a highly relaxed epitaxial SiGe layer with a low density of threading dislocations and a smooth surface can be achieved. The fabricating time for fabricating the strain-relaxed SiGe layers is greatly reduced and the surface roughness is improved. The structure enhances the performance of MOSFET elements. Besides, the degree of relaxation of the SiGe epitaxial layer is increased after an appropriate thermal annealing process.

It will be apparent to the person skilled in the art that the invention as described above may be varied in many ways, and notwithstanding remaining within the spirit and scope of the invention as defined in the following claims.

What is claimed is:

1. A construction of a thin strain-relaxed SiGe layers, comprising:
   an semiconductor substrate;
   a buffer layer formed on the semiconductor substrate and including Si and Ge;
   a Si(C) layer formed on the buffer layer, the buffer layer providing an in-plane lattice match between the buffer layer and the Si(C) layer, serving as a trapping center for misfit dislocations and suppressing the propagation of threading dislocations; and
   an epitaxial layer formed on the Si(C) layer and including Si and Ge, the Ge content in the buffer layer and the epitaxial layer being the same, the thickness of the epitaxial layer being thicker than the buffer layer, and the lattice constant of the Si(C) layer being smaller than that of the buffer layer and epitaxial layer.

2. A fabricating method of a thin strain-relaxed SiGe layers, comprising steps of:
   providing an semiconductor substrate;
   forming a buffer layer on the semiconductor substrate, the buffer layer including Si and Ge;
   forming a Si(C) layer on the buffer layer, the buffer layer providing an in-plane lattice match between the buffer layer and the Si(C) layer, serving as a trapping center for misfit dislocations and suppressing the propagation of threading dislocations;
   forming an epitaxial layer on the Si(C) layer, the epitaxial layer including Si and Ge, the Ge content in the buffer layer and the epitaxial layer being the same, the thickness of the epitaxial layer being thicker than the buffer layer, and the lattice constant of the Si(C) layer being smaller than that of the buffer layer and epitaxial layer; and
   annealing the epitaxial layer.

3. The method of claim 2 further comprises a step of annealing the epitaxial layer.

4. The method of claim 2, wherein the epitaxial layer is formed by the ultra-high vacuum chemical vapor deposition.

5. The method of claim 2, wherein the epitaxial layer is formed by the molecule beam epitaxy growth method.

6. The method of claim 2, wherein the epitaxial layer is formed by the low pressure chemical vapor deposition (LPCVD).

7. The method of claim 2, wherein the epitaxial layer is formed by the rapid thermal chemical vapor deposition.

8. The method of claim 2, wherein the epitaxial layer is formed by a method which can fabricate the SiGe(C) epitaxial alloys.

9. The method of claim 2, wherein the thickness of the buffer SiGe layer is thinner than a critical thickness of the buffer SiGe layer.

10. The method of claim 2, wherein the concentration of Ge in the epitaxial SiGe layer is the same, or larger than that of the buffer SiGe layer.

11. The method of claim 2, wherein the epitaxial layer, the Si(C) layer, and the buffer layer are formed by a method to fabricate the SiGe(C) epitaxial alloys.

12. The construction of claim 1, wherein the thickness of the buffer layer is thinner than a critical thickness of the buffer layer.

13. The construction of claim 1, wherein a concentration of Ge in the epitaxial SiGe layer is the same or larger than that of the buffer layer.

* * * * *